United States Patent
Meiser et al.

(10) Patent No.: US 10,845,428 B2
(45) Date of Patent: Nov. 24, 2020

(54) METHOD AND CIRCUIT FOR DETECTING A LOSS OF A BONDWIRE IN A POWER SWITCH

(71) Applicant: Infineon Technologies AG, Neubiberg (DE)

(72) Inventors: Andreas Meiser, Sauerlach (DE); Benno Koeppl, Markt Indersdorf (DE); Marcus Nuebling, Olching-Esting (DE); Markus Zannoth, Neubiberg (DE); Alexander Mayer, Treffen (AT)

(73) Assignee: Infineon Technologies AG, Neubiberg (DE)

( * ) Notice: Subject to any disclaimer, the term of this patent is extended or adjusted under 35 U.S.C. 154(b) by 182 days.

(21) Appl. No.: 15/995,858

(22) Filed: Jun. 1, 2018

(65) Prior Publication Data
US 2019/0369151 A1    Dec. 5, 2019

(51) Int. Cl.
*G01R 31/58* (2020.01)
*G01R 31/26* (2020.01)

(52) U.S. Cl.
CPC .............. *G01R 31/58* (2020.01); *G01R 31/26* (2013.01)

(58) Field of Classification Search
CPC ................................ G01R 31/58; G01R 31/26
See application file for complete search history.

(56) References Cited

U.S. PATENT DOCUMENTS

| 4,010,418 A * | 3/1977 | Salvatore | G01R 29/02 324/762.08 |
|---|---|---|---|
| 7,932,754 B1 | 4/2011 | Broach | |
| 2005/0017788 A1 | 1/2005 | Inoue | |

(Continued)

FOREIGN PATENT DOCUMENTS

| EP | 3255443 A1 | 12/2017 |
|---|---|---|
| JP | 2009124781 A | 6/2009 |

(Continued)

OTHER PUBLICATIONS

N.Y.A. Shammas, et al.; "Semiconductor Devices and Their Use in Power Electronic Applications," 7th WSEAS International Conference on Electric Power Systems, High Voltages, Electric Machines, Venice, Italy, Nov. 21-23, 2007, p. 258-263.

(Continued)

*Primary Examiner* — Akm Zakaria
(74) *Attorney, Agent, or Firm* — Eschweiler & Potashnik, LLC

(57) ABSTRACT

A driver circuit associated with a power electronic system is disclosed. The driver circuit comprises a gate driver circuit configured to drive a switching circuit comprising a plurality of switches in parallel, each switch comprising a respective source bondwire. The driver circuit further comprises a bondwire fault detection circuit comprising a gate charge estimation circuit configured to measure a parameter of the switching circuit comprising a gate charge of the switching circuit or a parameter indicative of the gate charge associated with the switching circuit. The bondwire fault detection circuit further comprises a detection circuit configured to detect a fault associated with at least one source bondwire of the switching circuit, based on the measured parameter of the switching circuit.

24 Claims, 11 Drawing Sheets

(56) References Cited

U.S. PATENT DOCUMENTS

| | | |
|---|---|---|
| 2006/0208789 A1 | 9/2006 | Shimada |
| 2010/0045328 A1* | 2/2010 | Suto ................... G01R 31/70 |
| | | 324/754.01 |
| 2010/0134091 A1 | 6/2010 | Eom |
| 2010/0231269 A1* | 9/2010 | Nakatake ......... H03K 17/08128 |
| | | 327/109 |
| 2014/0250617 A1 | 9/2014 | Gunjian |
| 2016/0190941 A1 | 6/2016 | Kuang |
| 2017/0054367 A1 | 2/2017 | Dhanasekaran |

FOREIGN PATENT DOCUMENTS

| | | |
|---|---|---|
| JP | 2013046485 A | 3/2013 |
| JP | 2013183600 A | 9/2013 |
| JP | 2013240148 A | 11/2013 |
| JP | 2014165939 A | 9/2014 |
| JP | 2015053749 A | 3/2015 |
| WO | 2017081856 A1 | 5/2017 |

OTHER PUBLICATIONS

R. Ruffilli, et al.; "Aluminum Metallization and Wire Bonding Aging in Power MOSFET Modules," https://hal.archives-ouvertes.fr/hal-01491384, Hal Archives—Ouvertes, Mar. 17, 2017, p. 1-11.
V. Barkhordarian; "Power MOSTFET Basics," International Rectifier, www.irf.com, Dec. 14, 2014, p. 1-13.
"Fundamentals of MOSTFET and IGBT Gate Driver Circuits," Texas Instruments Application Report, SLUA618—Mar. 2017—Revised SLUP169—Apr. 2002, p. 1-48.

\* cited by examiner

METHOD AND CIRCUIT FOR DETECTING A LOSS OF A BONDWIRE IN A POWER SWITCH

FIELD

The present disclosure relates to the field of power electronic systems, and in particular, to a method and circuit for detecting a loss of a bondwire associated with a power switch in the power electronic systems.

BACKGROUND

Power semiconductor devices are the key electronic components used in power electronic systems. The development of hybrid, mild hybrid and electric cars along with the integration of smart technologies have boosted the power electronics in automotive applications. Modern power semiconductor devices, for example, power switches, integrate several advanced capabilities in the field of security, safety, comfort etc. At the same time, during their everyday life the power switches have to support high current densities, because of the continuous shrinkage of new silicon technologies. Due to their widespread use in industry and the inherently high operating stress conditions, assessment of their failure mechanisms and reliability is a key issue.

BRIEF DESCRIPTION OF THE DRAWINGS

Some examples of circuits, apparatuses and/or methods will be described in the following by way of example only. In this context, reference will be made to the accompanying Figures.

DETAILED DESCRIPTION

Figure 1:
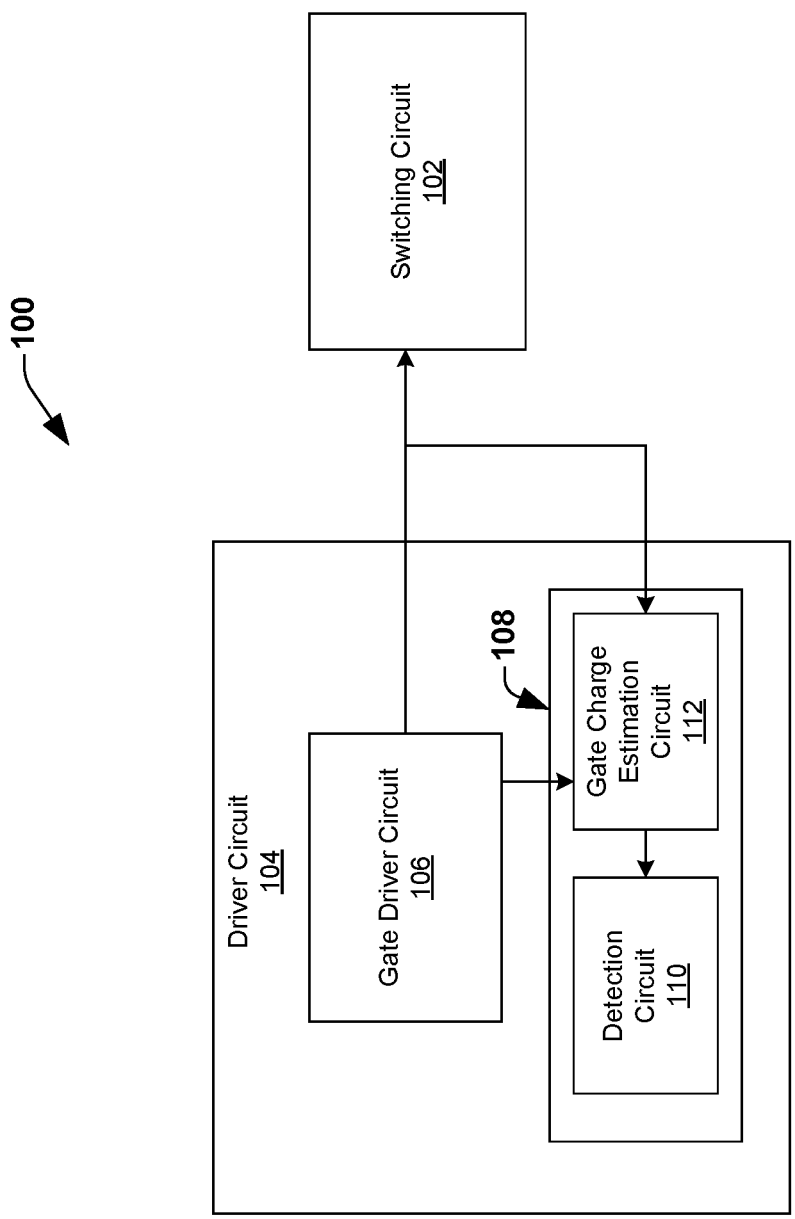
FIG. 1 illustrates a simplified block diagram of a power electronic system, according to one embodiment of the disclosure.

In one embodiment of the disclosure, a driver circuit associated with a power electronic system is disclosed. The power electronic system comprises a gate driver circuit configured to drive a switching circuit comprising a plurality of switches in parallel, each switch comprising a respective source bondwire. The power electronic system further comprises a bondwire fault detection circuit comprising a gate charge estimation circuit configured to measure a parameter of the switching circuit comprising a gate charge of the switching circuit or a parameter indicative of the gate charge associated with the switching circuit. In some embodiments, the gate charge estimation circuit further comprises a detection circuit configured to detect a fault associated with at least one source bondwire of the switching circuit, based on the measured parameter of the switching circuit.

In one embodiment of the disclosure, a method for detecting a fault associated with a source bondwire in a switching circuit comprising a plurality of switches in parallel, each switch comprising a respective source bondwire is disclosed. The method comprises measuring a parameter of the switching circuit comprising a gate charge of the switching circuit or a parameter indicative of the gate charge associated with the switching circuit. The method further comprises detecting a fault associated with at least one source bondwire of the switching circuit, based on the measured parameter of the switching circuit.

In one embodiment of the disclosure, a bondwire fault detection circuit is disclosed. The bondwire fault detection circuit comprises a gate charge estimation circuit configured to measure a parameter of a switching circuit comprising a plurality of switches in parallel, each switch comprising a respective source bondwire, the parameter of the switching circuit comprising a gate charge of the switching circuit or a parameter indicative of the gate charge associated with the switching circuit. The bondwire fault detection circuit further comprises a detection circuit configured to detect a fault associated with at least one source bondwire associated with the switching circuit, based on the measured parameter of the switching circuit.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from conte8, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from conte8 to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, due to the widespread use of power semiconductor switches in industry and the inherently high operating stress conditions, assessment of failure mechanisms of the power semiconductor switches (e.g., power MOSFETS) and their reliability is a key requirement. In the disclosure herein, failure of power semiconductor switches due to a loss or fault of source bondwires is assessed. Bondwires are utilized in semiconductor industry to establish an electrical connection from a semiconductor chip, for example, a power semiconductor switch, to its external package pins or to other electronic components. The term "source bondwire" utilized throughout the disclosure shall mean any conducting connection from the source metallization towards the outside, such as a clip, tape, etc., and shall not be limited to a bondwire only. A loss or fault at a bondwire associated with a power semiconductor switch can affect the safety and reliability of a power electronic system. Since a bond wire is limited in its current capability, in some embodiments, several bond wires are used in parallel for higher amperages. A loss of a source bond wire in a power switch application, e.g. a power MOSFET leads to an overload of the remaining source bondwire(s). This loss is not detectable and over lifetime it is possible that the remaining source bondwires also gets damaged because of increase current density in normal operation. The nominal current must flow only through the remaining bondwires and the rules for bondwire dimensioning are violated. Similarly, a loss of source bond wire in motor inverters, for example, the high-side switch, may lead to a loss of a freewheeling diodes associated therewith. The loss of freewheeling diodes may result in the generation of high voltages in the bridge caused by e.g. avalanche of MOSFETs and can cause damage of other components in the inverter. If the loss or failure associated with bondwires is not be detected, the system would be available for a short time and then would get into an unsafe state immediately without warning, which could lead to a dangerous situation (violating safety goals etc.). Therefore, it is important to determine/detect a loss or failure of bondwires associated with power switches in power electronic systems.

In current implementations of power electronic systems, a loss or failure associated with bondwires is detected based on a precise measurement of the on resistance (i.e., Ron) of the power switch, in some embodiments. For example, a precise measurement of the Ron is implemented on the ATE (automated test equipment) and each device is tested at 150° C., where the Ron shows in general the highest value. The accuracy of the Ron measurement must be in a range, which can detect a possible broken bondwire. If the measured Ron is higher than a maximum allowable value, the device is faulty and will not be delivered to customers. However, in the above implementation, the loss or failure associated with the bondwire is detected only once, during startup or configuration. Power switches are used in functional safety relevant application with a certain automotive safety integrity level (ASIL) level and therefore it is important to ensure that all bondwires are well connected, also in the running system. Further, in some implementations, for example, in case of motor inverters, Zener clamps are applied to MOSFETs to limit voltage in the system to the clamping voltage and components that can withstand the clamping voltage/avalanche voltage are utilized, in order to enable the system to handle a fault associated with a bondwire. However, in such embodiments, components such as gate drivers, capacitors etc. have to withstand higher voltages than the normal operating voltage, which causes higher costs for the inverters.

Therefore, in order to overcome the above disadvantages, a method to detect a fault of bondwires associated with power switches in real time during the product lifetime is proposed in this disclosure. In some embodiments, fault associated with a bondwire may refer to a loss or damage or failure of the bondwire. In particular, a method and an apparatus to determine a loss or failure of source bondwires associated with power switches based on measuring a gate charge or a parameter indicative of the gate charge associated with the power switch is proposed herein. In some embodiments, the proposed method is applicable to power switches that are separated into a number of smaller power switches in parallel. In particular, the proposed method is applicable to detect a loss or failure of source bondwires associated with a switching circuit comprising a plurality of switches in parallel, each parallel switch comprising a respective source bondwire. The key idea that is utilized herein is the fact that, in case a source bondwire associated with at least one parallel switch is lost or damaged, a gate charge of the switching circuit is reduced. In some embodiments, the gate charge of the switching circuit comprises a sum of the gate charges of the plurality of switches associated with the switching circuit. Therefore, in some embodiments, a measurement of the gate charge of the switching circuit or a parameter indicative of the gate charge of the switching circuit provides an indication of a possible damage/loss associated with at least one source bondwire of the switching circuit.

Therefore, in some embodiments, the proposed method enables to detect a partial fault/loss of the source bondwires of the switching circuit, thereby increasing the reliability of the power electronic system. In some embodiments, detection of a partial loss/failure of the source bondwires offers a possibility to protect the power electronic system from further damage. For example, in some embodiments, the detection of a partial bondwire loss provides an option to offload the switching circuit or initiate a repair of the switching circuit, thereby avoiding a catastrophic complete loss of the bondwires. Embodiments described throughout the disclosure describe a method and an apparatus for the detection of loss or fault of source bondwires associated with power MOSFETs. However, the proposed method is equally applicable to other power switches, for example, IGBTs, JFET etc., and is not to be construed to be limited to MOSFETs. In particular, in IGBT based switching circuits, the proposed method is applicable for the detection of loss or fault of emitter bondwires. Therefore, the term source bondwires utilized throughout the disclosure with respect to power MOSFET switches is to be considered equivalent to emitter bondwires with respect to other power switches like IGBTs.

FIG. 1 illustrates a simplified block diagram of a power electronic system 100, according to one embodiment of the disclosure. The power electronic circuit 100 comprises a switching circuit 102 and a driver circuit 104 configured to couple to the switching circuit 102, in order to drive the switching circuit 102. In some embodiments, the switching circuit 102 comprises power semiconductor switches or power switches, for example, power MOSFETs. In some embodiments, the power switch within the switching circuit 102 may be implemented as a plurality of power switches in parallel, each parallel switch comprising a respective source bondwire. In some embodiments, the source bondwire associated with each parallel power switch may comprise one or more bondwires coupled between a contact pad associated with a source terminal of the respective parallel power switch and an external package pin of the power switch or to other electronic components, for example, other power switches. In this embodiment, the power electronic system 100 is shown to include only a single switching circuit 102 and a corresponding driver circuit 104, for the ease of explanation. However, in other embodiments, the power electronic system 100 may include a plurality of switching circuits and a corresponding plurality of driver circuits. Exemplary embodiments describing how the source bondwires may be coupled between a contact pad associated with a source terminal of a respective parallel power switch and an external package pin of the power switch will be illustrated with respect to FIGS. 2a, 2b, 4a, 4b, 5a, 5b, 6, 7a and 7b, in which the contact pad associated with the source terminal of the respective parallel power switch is referred to as "pad" and the external package pin of the power switch is referred to as "pin".

Figure 2B:
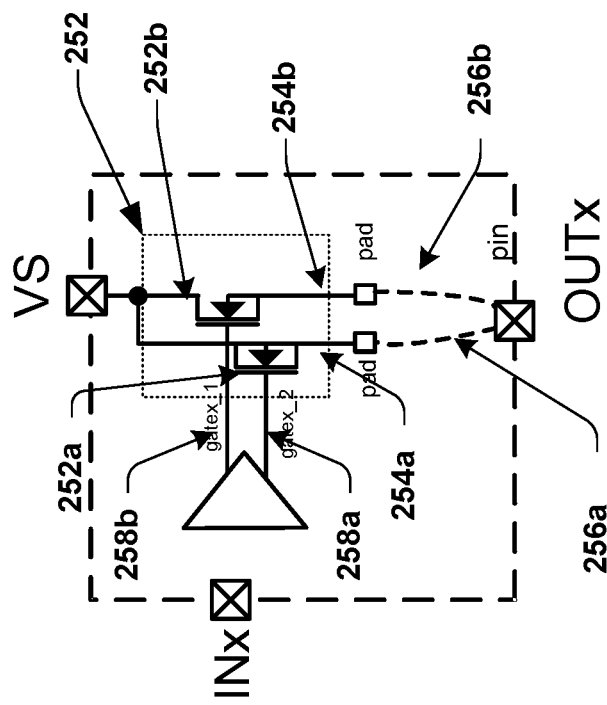
FIG. 2b illustrates an example implementation of a switching circuit, according to another embodiment of the disclosure.
Figure 2A:
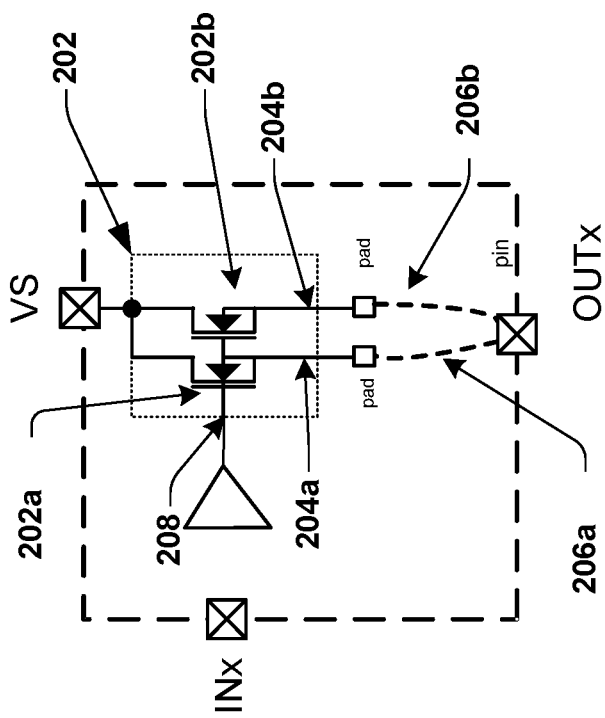
FIG. 2a illustrates an example implementation of a switching circuit, according to one embodiment of the disclosure.

In some embodiments, the plurality of power switches within the switching circuit 102 may comprise a common gate terminal and separate source terminals, as illustrated in FIG. 2a. In some switching circuits, for example, in IGBT based switching circuits, the common gate terminal is replaced by a common base terminal, and the separated source terminals are replaced by separate emitter terminals. In other embodiments, the plurality of power switches within the switching circuit 102 may comprise separate gate terminals and separate source terminals, as illustrated in FIG. 2b. In some switching circuits, for example, in IGBT based switching circuits, the separate gate terminals are replaced by separate base terminals, and the separate source terminals are replaced by separate emitter terminals.

FIG. 2a illustrates an example implementation of a switching circuit 202 comprising two parallel power switches. In other embodiments, however, the switching circuit 202 may comprise more than two parallel power switches. In some embodiments, the switching circuit 202 depicts one possible implementation of the switching circuit 102 in FIG. 1. The two parallel power switches in the switching circuit 202 comprise MOSFETs in this embodiment. However, in other embodiments, the two parallel switches can comprise other power switches like IGBT, FET etc. and shall not be limited to power MOSFETs. The switching circuit 202 comprises a first power switch 202a and a second power switch 202b in parallel having separate sources 204a and 204b, respectively, and a common gate terminal 208. The first power switch 202a and the second power switch 202b further comprise a first source bondwire 206a and a second source bondwire 206b respectively associated therewith. In some embodiments, the first source bondwire 206a may comprise a single bondwire as illustrated in FIG. 2a. However, in other embodiments, the first source bondwire 206a may be implemented as a plurality of source bondwires. Similarly, in some embodiments, the second source bondwire 206b may comprise a single bondwire as illustrated in FIG. 2a. However, in other embodiments, the second source bondwire 206b may be implemented as a plurality of source bondwires.

Similarly, FIG. 2b illustrates another example implementation of a switching circuit 252 comprising two parallel power switches. In other embodiments, however, the switching circuit 252 may comprise more than two parallel power switches. In some embodiments, the switching circuit 252 depicts another possible way of implementation of the switching circuit 102 in FIG. 1. The two parallel power switches in the switching circuit 252 comprises MOSFETs in this embodiment. However, in other embodiments, the two parallel switches can comprise other power switches like IGBT, FET etc. and is not to be construed to be limited to power MOSFETs. The switching circuit 252 comprises a first power switch 252a and a second power switch 252b in parallel having separate sources 254a and 254b, respectively. Further, the first power switch 252a and the second power switch 252b comprises a first gate terminal 258a and a second gate terminal 258b respectively associated therewith. The first power switch 252a and the second power switch 252b further comprise a first source bondwire 256a and a second source bondwire 256b, respectively associated therewith. In some embodiments, the first source bondwire 256a may comprise a single bondwire as illustrated in FIG. 2b. However, in other embodiments, the first source bondwire 256a may be implemented as a plurality of source bondwires. Similarly, in some embodiments, the second source bondwire 256b may comprise a single bondwire as illustrated in FIG. 2b. However, in other embodiments, the second source bondwire 256b may be implemented as a plurality of source bondwires.

Referring back to FIG. 1, the driver circuit 104 comprises a gate driver circuit 106 configured to drive the switching circuit 102. In the embodiments where the switching circuit 102 comprises a common gate terminal as illustrated in FIG. 2a, the gate driver circuit 106 may be coupled to the common gate terminal, in order to drive the switching circuit 102. Alternately, in other embodiments where the switching circuit 102 comprises separated gate terminals, as illustrated in FIG. 2b, the gate driver circuit 106 may comprise different driver output stages to drive to drive the respective gate terminals. In some embodiments, the driver circuit 104 further comprises a bondwire fault detection circuit 108 configured to detect a fault associated with at least one source bondwire associated with the switching circuit 102. In some embodiments, a fault associated with the source bondwire can comprise a broken or damaged or lost bondwire. However, other types of fault different from above are also contemplated to be within the scope of this disclosure. In some embodiments, the bondwire fault detection circuit 108 is coupled to the gate driver circuit 106. In some embodiments, the bondwire fault detection circuit 108 is further configured to couple to the switching circuit 102. In some embodiments, both the gate driver circuit 106 and the bondwire fault detection circuit 108 are implemented as part of a same driver integrated circuit (IC). However, in other embodiments, the gate driver circuit 106 and the bondwire fault detection circuit 108 may be implemented on separate ICs.

In some embodiments, the bondwire fault detection circuit 108 comprises a gate charge estimation circuit 112 configured to measure a parameter of the switching circuit 102 comprising a gate charge of the switching circuit 102 or a parameter indicative of the gate charge associated with the switching circuit 102. In some embodiments, the gate charge estimation circuit 112 is configured to couple to the gate driver circuit 102 or the switching circuit 102, in order to measure the gate charge of the switching circuit 102 or the parameter indicative of the gate charge associated with the switching circuit 102. In some embodiments, the bondwire fault detection circuit 108 further comprises a detection circuit 110 configured to detect a fault associated with at least one source bondwire of the switching circuit 102, based on the measured parameter of the switching circuit 102. As indicated above, the key idea that is utilized herein is the fact that, in case a source bondwire associated with at least one parallel switch is lost or damaged, a gate charge of the switching circuit 102 is reduced. In some embodiments, the gate charge of the switching circuit 102 is proportional to a charge of the internal capacitors, for example, the gate source capacitors associated with the switching circuit 102. In case a source bondwire associated with a parallel switch is lost or damaged, a corresponding gate source capacitance of the parallel switch is not charged, thereby resulting in a reduction of the gate charge associated with the switching circuit 102.

Therefore, in some embodiments, a measurement of the gate charge of the switching circuit 102 or a parameter indicative of the gate charge of the switching circuit 102 provides an indication of a possible damage/loss associated with at least one source bondwire (e.g., 206a or 206b or both in FIG. 2a) of the switching circuit 102. In some embodiments, the gate charge estimation circuit 112 is configured to measure the gate charge of the switching circuit 102 or the parameter indicative of the gate charge associated with the switching circuit 102 at every switching event or a plurality of switching events associated with the switching circuit 102. In some embodiments, measuring the gate charge at a plurality of switching events of the switching circuit 102 enables the bondwire fault detection circuit 108 to detect a fault associated with the bondwires of the switching circuit 102 in real time during a product lifetime. Upon detecting the fault, in some embodiments, the detection circuit 110 is further configured to generate a fault indication signal (not shown) that provides an indication of a possible loss or damage associated with the source bondwires of the switching circuit 102.

Figure 3B:
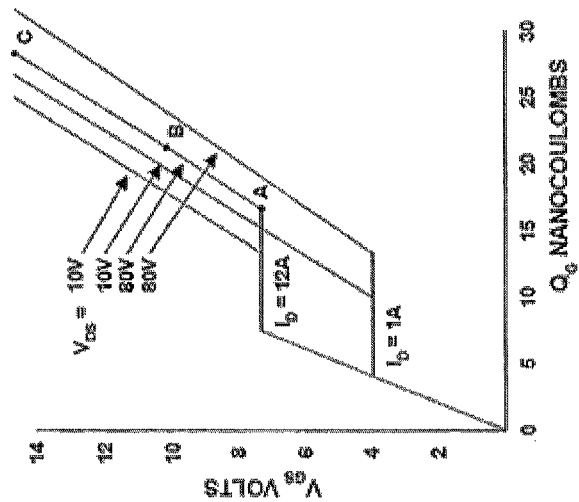
FIG. 3b illustrates a dependency of a gate voltage and gate charge of the switching MOSFET in relation to a drain voltage $V_{Ds}$ and applied drain current $I_D$, according to one embodiment of the disclosure.
Figure 3A:
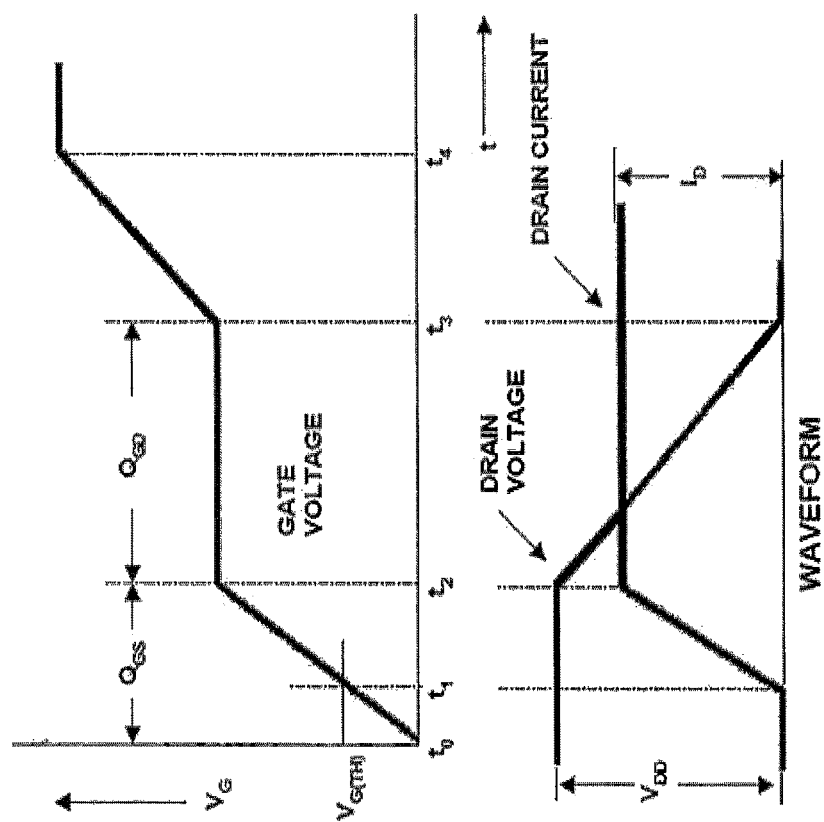
FIG. 3a illustrates the gate charge waveforms of a switching MOSFET, according to one embodiment of the disclosure.

FIG. 3a illustrates the gate charge waveforms of a switching MOSFET. Further, FIG. 3b illustrates the dependency of the gate voltage and gate charge of the switching MOSFET on the drain voltage $V_{Ds}$ and applied drain current $I_D$. Referring back to FIG. 1, in some embodiments, the detection circuit 110 is configured to detect the fault based on a comparison of the measured parameter of the switching circuit 102 to a predetermined measurement parameter threshold. In some embodiments, the predetermined measurement parameter threshold comprises an earlier value of the measured parameter of the switching circuit 102 measured at an earlier instant of time, further details of which are given in embodiments below. Alternately, in other embodiments, the detection circuit 110 is configured to detect the fault based on a comparison of the measured parameter of the switching circuit 102 to a predefined threshold range, further details of which are given in an embodiment below.

Figure 4A:
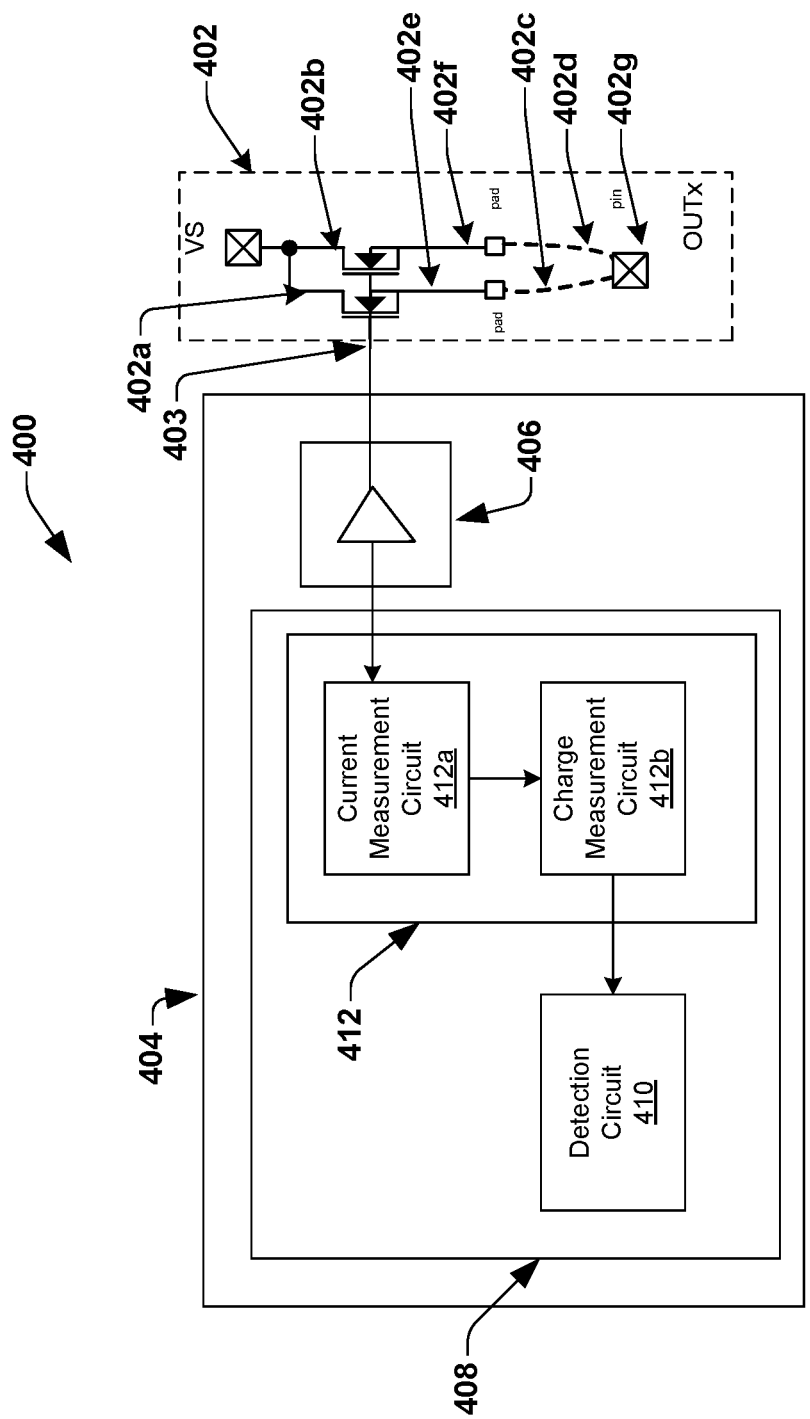
FIGS. 4a and 4b illustrate an example implementation of a power electronic system, according to one embodiment of the disclosure.
Figure 4B:
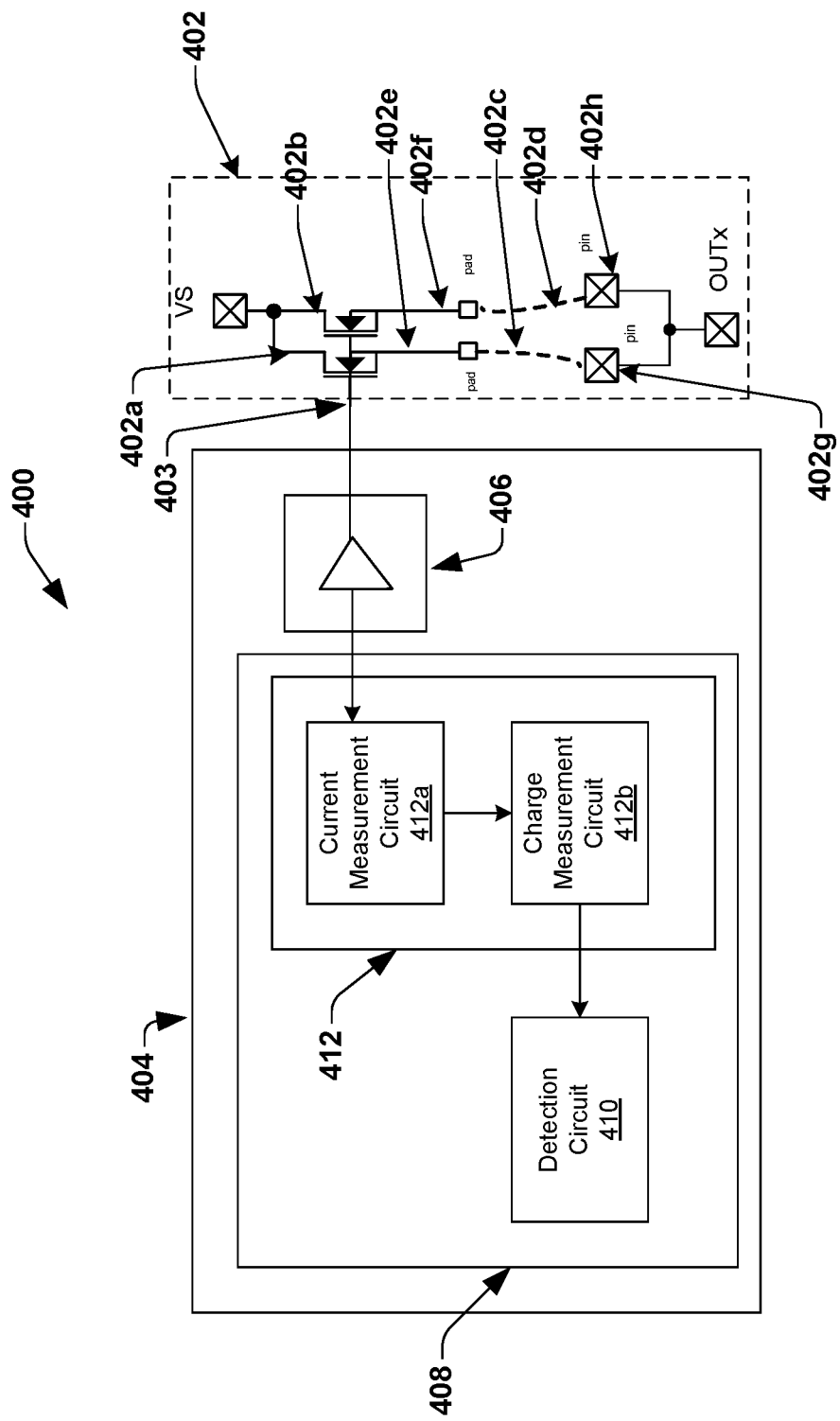

FIG. 4a illustrates an example implementation of a power electronic system 400, according to one embodiment of the disclosure. In some embodiments, the power electronic system 400 comprises one possible way of implementation of the power electronic system 100 in FIG. 1. The power electronic system 400 comprises a switching circuit 402 and a driver circuit 404 configured to drive the switching circuit 402. In this example embodiment, the switching circuit 402 is shown to include a first power switch 402a and a second power switch 402b, in parallel to one another. However, in other embodiments, the switching circuit 402 can comprise more than two power switches in parallel. The switching circuit 402 comprises a common gate terminal 403 and separated source terminals 402e and 402f. The switching circuit 402 further comprises source bondwires 402c and 402d respectively coupled to the source terminals 402e and 402f. In this embodiment, the source bondwires 402c and 402d are shown to be coupled to a single external output pin 402g. However, in other embodiments, the source bondwires 402c and 402d may be coupled to two separate output pins 402g and 402h, respectively, as illustrated in FIG. 4b. Even though not indicated explicitly, the concept of using separate output pins for the source bondwires associated with parallel switches of the switching circuit is applicable to all embodiments described in this disclosure.

The driver circuit 404 comprises a gate driver circuit 406 coupled to the common gate terminal 403 of the switching circuit 402 and configured to drive the switching circuit 402. The driver circuit further comprises a bondwire fault detection circuit 408 configured to detect a fault associated with at least one source bondwire (e.g., 402c or 402d) associated with the switching circuit 402. The bondwire fault detection circuit 408 comprises a gate charge estimation circuit 412 configured to determine a gate charge associated with the switching circuit 402 and a detection circuit 410 configured to determine a fault associated with at least one source bondwire of the switching circuit 402 based on the determined gate charge. In some embodiments, the gate charge associated with the switching circuit 402 is proportional to a charge associated with internal capacitors, for example, the gate source capacitors of the switching circuit 402. In some embodiments, both the first power switch 402a and the second power switch 402b comprise a respective gate source capacitance. In some embodiments, if one of the source bondwires, for example, 402c is lost or damaged, a corresponding gate source capacitance is not charged, resulting in a reduction of the gate charge associated with the switching circuit 402.

The gate charge estimation circuit 412 comprises a current measurement circuit 412a coupled to the common gate terminal 403 and configured to generate a replica of a gate current at the common gate terminal 403. The gate charge estimation circuit 412 further comprises a charge measurement circuit 412 coupled to the current measurement circuit 412a and configured to determine a corresponding gate charge based on an integration of the generated replica of the gate current. In some embodiments, the current measurement circuit 412a comprises a current mirror circuit. Further, in some embodiments, the charge measurement circuit 412b may comprise a capacitor as an integration element. However, in other embodiments, the current measurement circuit 412a and the charge measurement circuit 412b may be implemented differently. Upon determining the gate charge associated with the switching circuit 402, the detection circuit 410 is configured to compare the determined gate charge to a predetermined threshold value comprising a predetermined gate charge, in order to determine a fault associated with at least one source bondwire of the switching circuit 402.

In some embodiments, a fault associated with at least one source bondwire of the switching circuit 402 is determined at the detection circuit 410, when the determined gate charge is different from the predetermined gate charge by a certain predefined value. For example, in some embodiments, a fault associated with at least one source bondwire of the switching circuit 402 is determined at the detection circuit 410, when the determined gate charge is less than the predetermined gate charge by a certain predefined value. In some embodiments, the predetermined gate charge comprises an earlier value of gate charge associated with the switching circuit 402 measured at an earlier instant of time. In some embodiments, the predetermined gate charge comprises a gate charge associated with the switching circuit 402 measured at a time when both the source bondwires 402c and 402d are well connected. However, in other embodiments, the predetermined gate charge can be determined differently than above and may comprise a default value. Upon detecting a fault, in some embodiments, the detection circuit 410 is further configured to generate a fault indication signal (not shown) that provides an indication of a possible loss or damage associated with the source bondwires of the switching circuit 402.

Figure 5A:
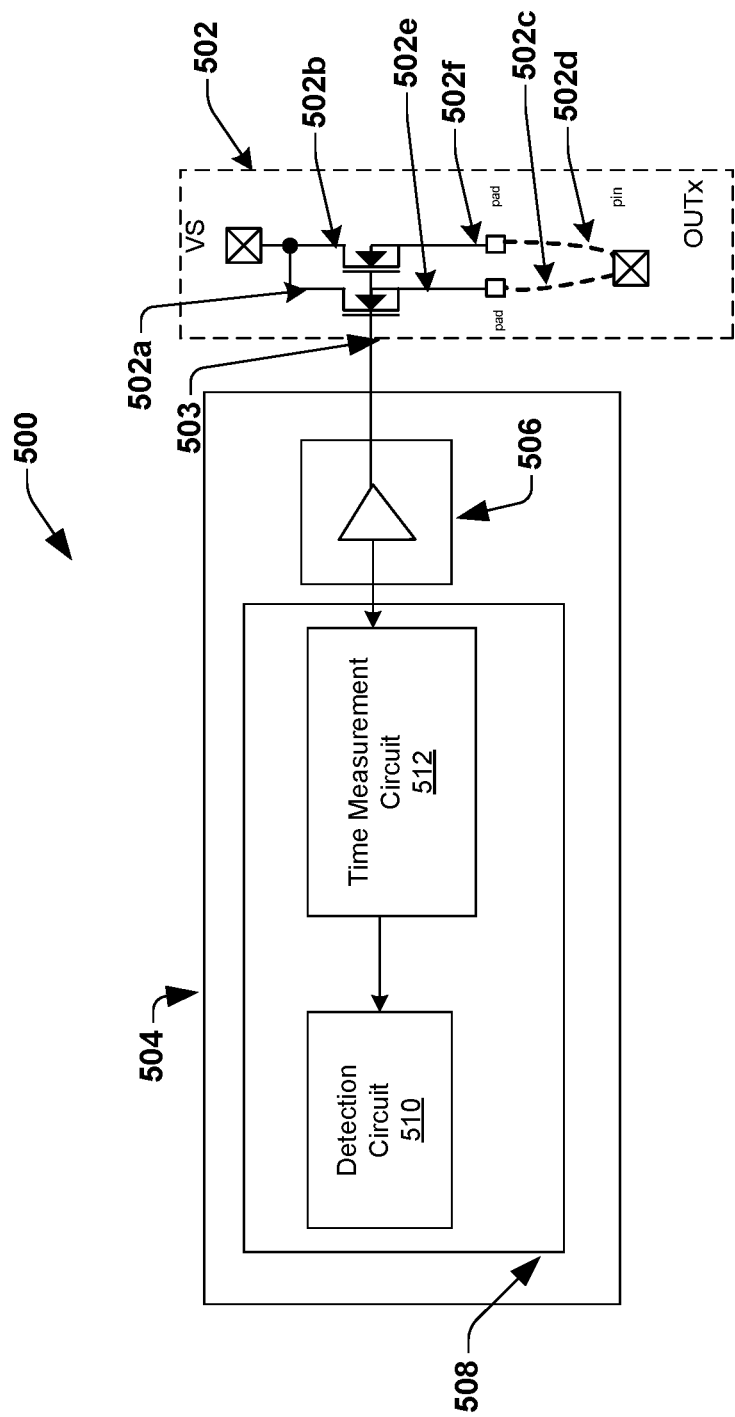
FIGS. 5a and 5b illustrate an example implementation of a power electronic system, according to another embodiment of the disclosure.

FIG. 5a illustrates an example implementation of a power electronic system 500, according to another embodiment of the disclosure. In some embodiments, the power electronic system 500 comprises another possible way of implementation of the power electronic system 100 in FIG. 1. The power electronic system 500 comprises a switching circuit 502 and a driver circuit 504 configured to drive the switching circuit 502. In this example embodiment, the switching circuit 502 is shown to include a first power switch 502a and a second power switch 502b, in parallel to one another. However, in other embodiments, the switching circuit 502 can comprise more than two power switches in parallel. The switching circuit 502 comprises a common gate terminal 503 and separated source terminals 502e and 502f. The switching circuit 502 further comprises source bondwires 502c and 502d respectively coupled to the source terminals 502e and 502f.

The driver circuit 504 comprises a gate driver circuit 506 coupled to the common gate terminal 503 of the switching circuit 502 and configured to drive the switching circuit 502. The driver circuit 504 further comprises a bondwire fault detection circuit 508 configured to detect a fault associated with at least one source bondwire (e.g., 502c or 502d) associated with the switching circuit 502. In some embodiments, both the gate driver circuit 506 and the bondwire fault detection circuit 508 are implemented as part of a same driver integrated circuit (IC). However, in other embodiments, the gate driver circuit 506 and the bondwire fault detection circuit 508 may be implemented on separate ICs. The bondwire fault detection circuit 508 comprises a time measurement circuit 512 configured to measure a turn-on time required to turn on the switching circuit 502 or a turn-off time required to turn-off the switching circuit 502. In some embodiments, the turn-on time or the turn-off time of the switching circuit 502 is indicative of a gate charge of the switching circuit 502. In some embodiments, the turn-on time or the turn-off time of the switching circuit 502 is proportional to the gate charge of the switching circuit 502. For example, if one of the source bondwires 502c is lost or damaged, the gate charge associated with the switching circuit 502 is reduced (since the corresponding gate source capacitance need not be charged), thereby resulting in a reduction of the turn-on time or turn-off time of the switching circuit 502. In some embodiments, the time measurement circuit 512 comprises one possible way of implementation of the gate charge estimation circuit 112 explained above with respect to FIG. 1.

Figure 5B:
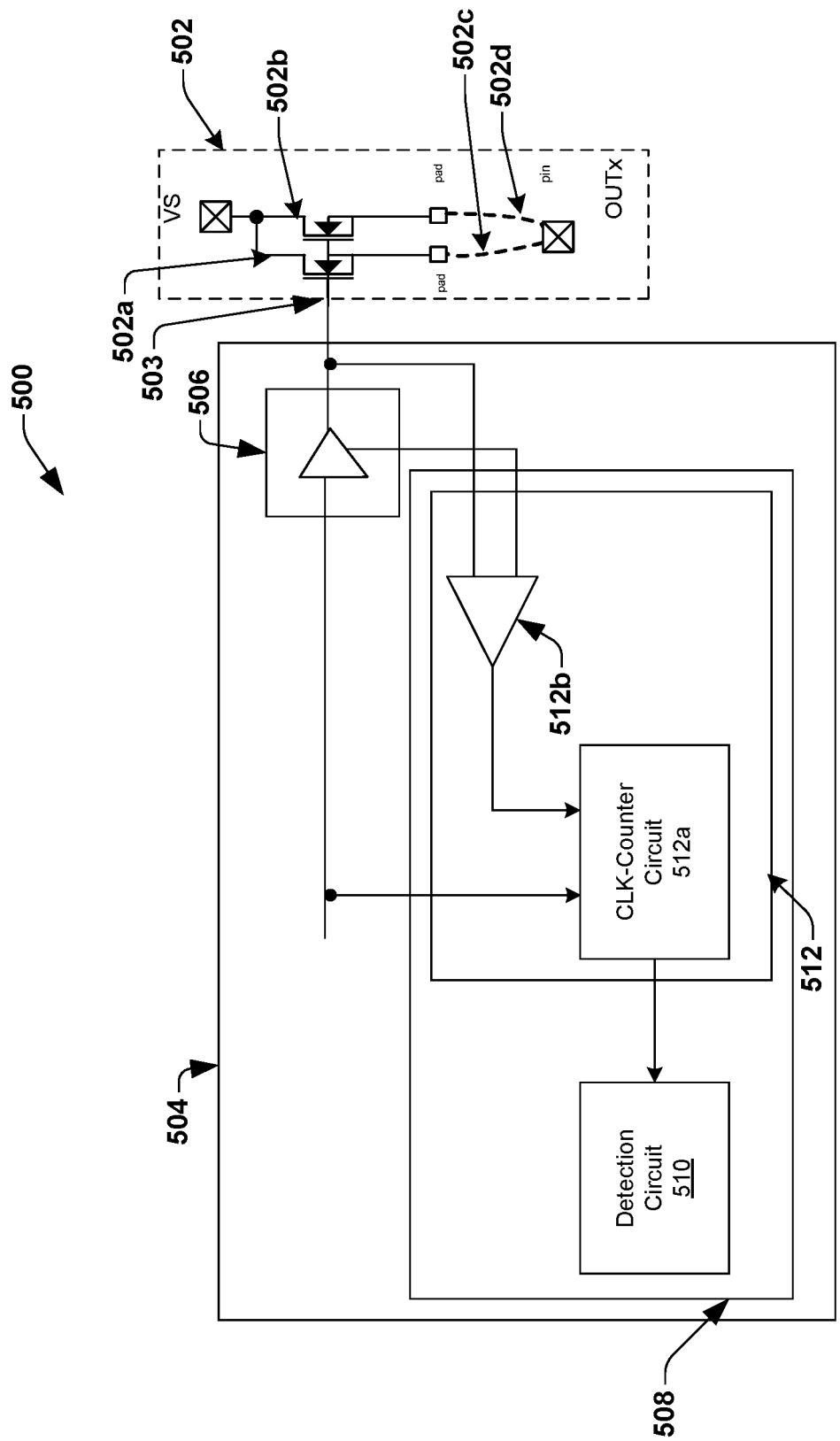

In some embodiments, the time measurement circuit 512 comprises a CLK-counter circuit 512a comprising a counter or a shift register and a gate voltage comparator circuit 512b, as illustrated in FIG. 5b. In other embodiments, however, the time measurement circuit 512 can be implemented differently. In some embodiments, the power electronic system 500 in FIG. 5b is same as the power electronic system 500 in FIG. 5a and is utilized herein to illustrate one possible way of implementation of the time measurement circuit 512 in FIG. 5a. Therefore, all the explanations given above with respect to FIG. 5a are applicable to FIG. 5b. In order to measure the turn-on time of the switching circuit 502, in some embodiments, the CLK-counter circuit 512a is configured to start counting at a start time of the gate driver circuit 506. In some embodiments, the CLK-counter circuit 512a is coupled to an input terminal of the gate driver circuit 506 and is configured to start counting at toggling an input signal of the gate driver circuit 506. In some embodiments, the CLK-counter circuit 512a is further configured to stop counting when the switching circuit 502 is turned on. In some embodiments, the CLK-counter circuit 512a is configured to stop counting based on an indication from the gate voltage comparator circuit 512b. In some embodiments, the gate voltage comparator circuit 512b provides an indication to the CLK-counter circuit 512a when the switching circuit 502 is turned on. Alternately, in other embodiments, the CLK-counter circuit 512a may be configured to measure the turn-off time of the switching circuit 502, in order to estimate the gate charge.

Referring back to FIG. 5a, in some embodiments, the bondwire fault detection circuit 508 further comprises a detection circuit 510 configured to determine a fault associated with at least one source bondwire of the switching circuit 502 based on the measured turn-on time or the turn-off time. In some embodiments, the detection circuit 510 is configured to compare the measured turn-on time or the turn-off time to a predetermined threshold value comprising a predetermined turn-on time or a predetermined turn-off time respectively, in order to determine the fault associated with at least one source bondwire of the switching circuit 502. In some embodiments, a fault associated with at least one source bondwire of the switching circuit 502 is determined at the detection circuit 510, when the measured turn-on time is different from the predetermined turn-on time by a certain predefined value or the measured turn-off time is different from the predetermined turn-off time by a certain predefined value. For example, in some embodiments, a fault associated with at least one source bondwire of the switching circuit 502 is determined at the detection circuit 510, when the measured turn-on time is less than the predetermined turn-on time by a certain predefined value or the measured turn-off time is less than the predetermined turn-off time by a certain predefined value. In some embodiments, the predetermined turn-on time comprises an earlier value of turn-on time associated with the switching circuit 502 measured at an earlier instant of time. In some embodiments, the predetermined turn-on time comprises a turn-on time associated with the switching circuit 502 measured at a time when both the source bondwires 502c and 502d are well connected. However, in other embodiments, the predetermined turn-on time can be determined differently than above and may comprise a default value. Similarly, in some embodiments, the predetermined turn-off time comprises an earlier value of turn-off time associated with the switching circuit 502 measured at an earlier instant of time. In some embodiments, the predetermined turn-off time comprises a turn-off time associated with the switching circuit 502 measured at a time when both the source bondwires 502c and 502d are well connected. However, in other embodiments, the predetermined turn-off time can be determined differently than above and may comprise a default value. Upon detecting a fault, in some embodiments, the detection circuit 510 is further configured to generate a fault indication signal (not shown) that provides an indication of a possible loss or damage associated with the source bondwires of the switching circuit 502.

Figure 6:
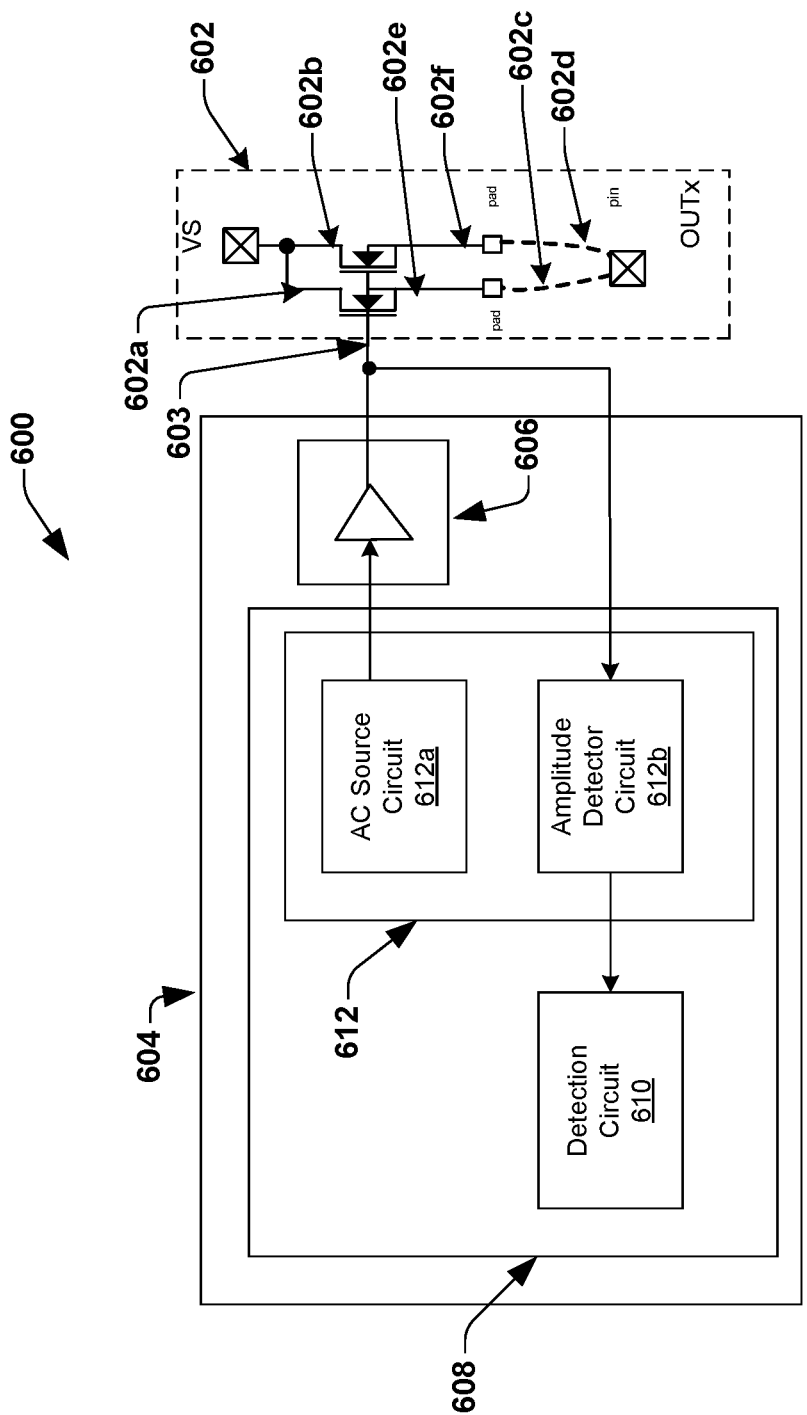
FIG. 6 illustrates an example implementation of a power electronic system, according to another embodiment of the disclosure.

FIG. 6 illustrates an example implementation of a power electronic system 600, according to another embodiment of the disclosure. In some embodiments, the power electronic system 600 comprises another possible way of implementation of the power electronic system 100 in FIG. 1. The power electronic system 600 comprises a switching circuit 602 and a driver circuit 604 configured to drive the switching circuit 602. In this example embodiment, the switching circuit 502 is shown to include a first power switch 602a and a second power switch 602b, in parallel to one another. However, in other embodiments, the switching circuit 602 can comprise more than two power switches in parallel. The switching circuit 602 comprises a common gate terminal 603 and separated source terminals 602e and 602f. The switching circuit 602 further comprises source bondwires 602c and 602d respectively coupled to the source terminals 602e and 602f.

The driver circuit 604 comprises a gate driver circuit 606 coupled to the common gate terminal 603 of the switching circuit 602 and configured to drive the switching circuit 602. The driver circuit further comprises a bondwire fault detection circuit 608 configured to detect a fault associated with at least one source bondwire (e.g., 602c or 602d or both) associated with the switching circuit 602. In some embodiments, both the gate driver circuit 606 and the bondwire fault detection circuit 608 are implemented as part of a same driver integrated circuit (IC). However, in other embodiments, the gate driver circuit 606 and the bondwire fault detection circuit 608 may be implemented on separate ICs. The bondwire fault detection circuit 608 comprises a gate charge estimation circuit 612 configured to determine a parameter indicative of a gate charge associated with the switching circuit 602 and a detection circuit 610 configured to determine a fault associated with at least one source bondwire of the switching circuit 602 based on the determined parameter.

In some embodiments, the gate charge estimation circuit 612 comprises an alternating current (AC) source circuit 612a coupled to the common gate terminal 603 of the switching circuit 602 and configured to output an AC signal to the common gate terminal 603. In some embodiments, the alternating current (AC) source circuit 612a is coupled to the common gate terminal 603 via the gate driver circuit 606. The gate charge estimation circuit 612 further comprises an amplitude detector circuit 612b configured to couple the common gate terminal 603 and configured to measure an amplitude of the AC signal at the common gate terminal 603. In some embodiments, the amplitude of the AC signal at the common gate terminal 603 is indicative of the gate charge of the switching circuit 602. For example, in some embodiments, when one of the source bondwires, for example, the source bondwire 602c is lost or damaged, gate charge of the switching circuit 602 is reduced. In some embodiments, a reduction of the gate charge of the switching circuit 602 results in an increase in the amplitude of the AC signal compared to an earlier value of the AC signal (e.g., when both the source bondwires 602c and 602d are well connected). Therefore, in such embodiments, a measurement of the amplitude of the AC signal at the common gate terminal 603 of the switching circuit 602 provides an indication of a possible loss or damage of at least one source bondwire of the switching circuit 602.

Once the amplitude of the AC signal is measured at the amplitude detector circuit 612b, the detection circuit 610 is configured to compare the measured AC signal amplitude to a predetermined threshold value comprising a predetermined AC signal amplitude, in order to determine a fault associated with at least one source bondwire of the switching circuit 602. In some embodiments, a fault associated with at least one source bondwire of the switching circuit 602 is determined at the detection circuit 610, when the measured AC signal amplitude is different from the predetermined AC signal amplitude by a certain predefined value. For example, in some embodiments, a fault associated with at least one source bondwire of the switching circuit 602 is determined at the detection circuit 610, when the determined AC signal amplitude is greater than the predetermined AC signal amplitude by a certain predefined value. In some embodiments, the predetermined AC signal amplitude comprises an earlier value of AC signal amplitude associated with the switching circuit 602 measured at an earlier instant of time. In some embodiments, the predetermined AC signal amplitude comprises an AC signal amplitude associated with the switching circuit 602 measured at a time when both the source bondwires 602c and 602d are well connected. However, in other embodiments, the predetermined AC signal amplitude can be determined differently than above and may comprise a default value. Upon detecting a fault, in some embodiments, the detection circuit 610 is further configured to generate a fault indication signal (not shown) that provides an indication of a possible loss or damage associated with the source bondwires of the switching circuit 602.

Figure 7A:
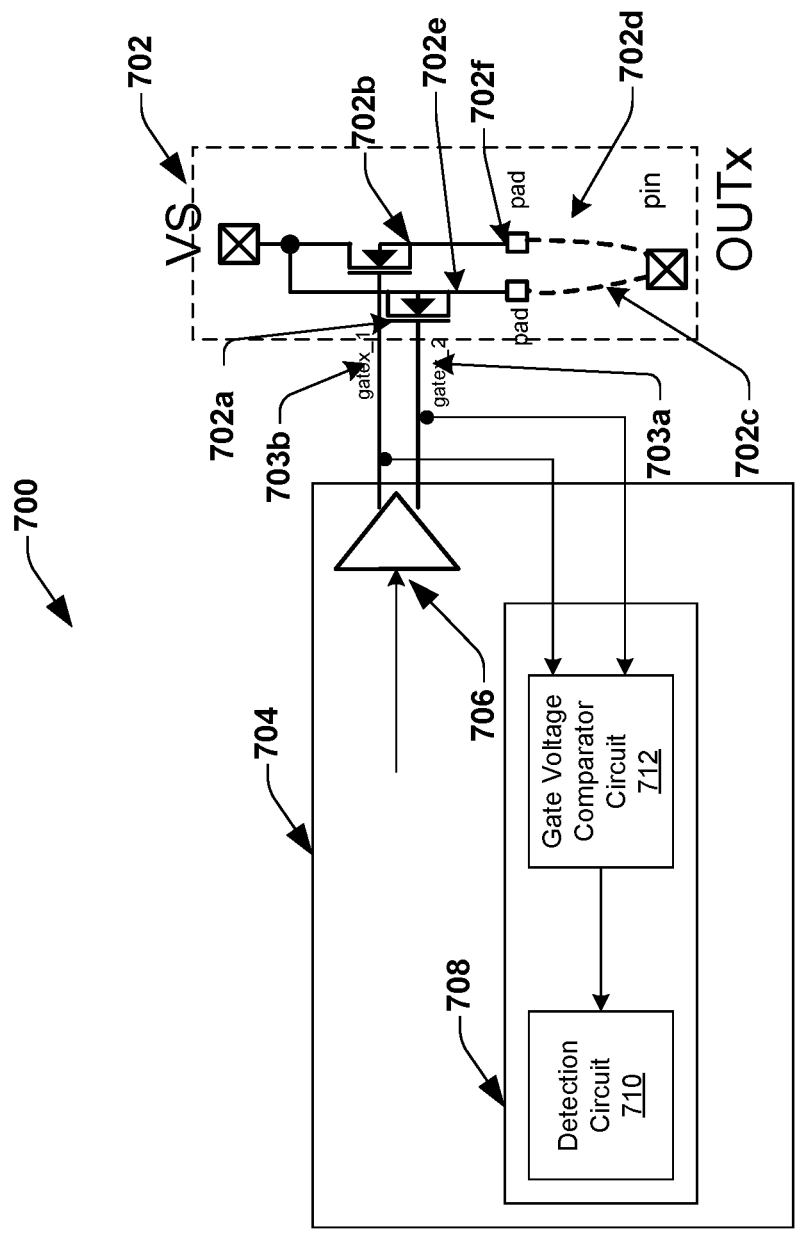
FIGS. 7a and 7b illustrate an example implementation of a power electronic system, according to another embodiment of the disclosure.

FIG. 7a illustrates an example implementation of a power electronic system 700, according to one embodiment of the disclosure. In some embodiments, the power electronic system 700 comprises another possible way of implementation of the power electronic system 100 in FIG. 1. The power electronic system 700 comprises a switching circuit 702 and a driver circuit 704 configured to drive the switching circuit 702. In this example embodiment, the switching circuit 702 is shown to include a first power switch 702a and a second power switch 702b, in parallel to one another. However, in other embodiments, the switching circuit 702 can comprise more than two power switches in parallel. The switching circuit 702 comprises a first gate terminal 703a and a second gate terminal 703b respectively associated with the first power switch 702a and the second power switch 702b. The switching circuit 702 further comprises separated source terminals 702e and 702f, and source bondwires 702c and 702d respectively coupled to the source terminals 702e and 702f.

The driver circuit 704 comprises a gate driver circuit 706 coupled to the first gate terminal 703a and the second gate terminal 703b of the switching circuit 702 and configured to drive the switching circuit 702. The driver circuit 704 further comprises a bondwire fault detection circuit 708 configured to detect a fault associated with at least one source bondwire (e.g., 702c or 702d or both) associated with the switching circuit 702. In some embodiments, both the gate driver circuit 706 and the bondwire fault detection circuit 708 are implemented as part of a same driver integrated circuit (IC). However, in other embodiments, the gate driver circuit 706 and the bondwire fault detection circuit 708 may be implemented on separate ICs. The bondwire fault detection circuit 708 comprises a gate voltage comparator circuit 712 configured to measure a voltage difference between a first gate voltage associated with the first power switch 702a and a second gate voltage associated with the second power switch 702b, during a turn-on phase or a turn-off phase of the switching circuit 702. In some embodiments, the measured voltage difference is indicative of the gate charge of the switching circuit 702.

For example, if both the source bondwires 702c and 702d are well connected, the gate voltages of the respective power switches rise or fall in the same way, because the same gate charge on both gates are needed. Therefore, in such instances a voltage difference between the first gate voltage and the second gate voltage will be minimal. However, if one source bondwire, for example, the source bondwire 702c is lost or damaged, the respective gate is charged or discharged much faster compared to the other gate, which is normally charged or discharged. Therefore, in such instance a voltage difference between the first gate voltage and the second gate voltage is increased. In embodiments where the switching circuit 702 comprises more than two power switches in parallel, the gate voltage comparator circuit 712 may be configured to measure a voltage difference between the gate voltages respectively associated with the various power switches in the switching circuit 702. In some embodiments, the gate voltage comparator circuit 712 comprises one possible way of implementation of the gate charge estimation circuit 112 explained above with respect to FIG. 1.

Figure 7B:
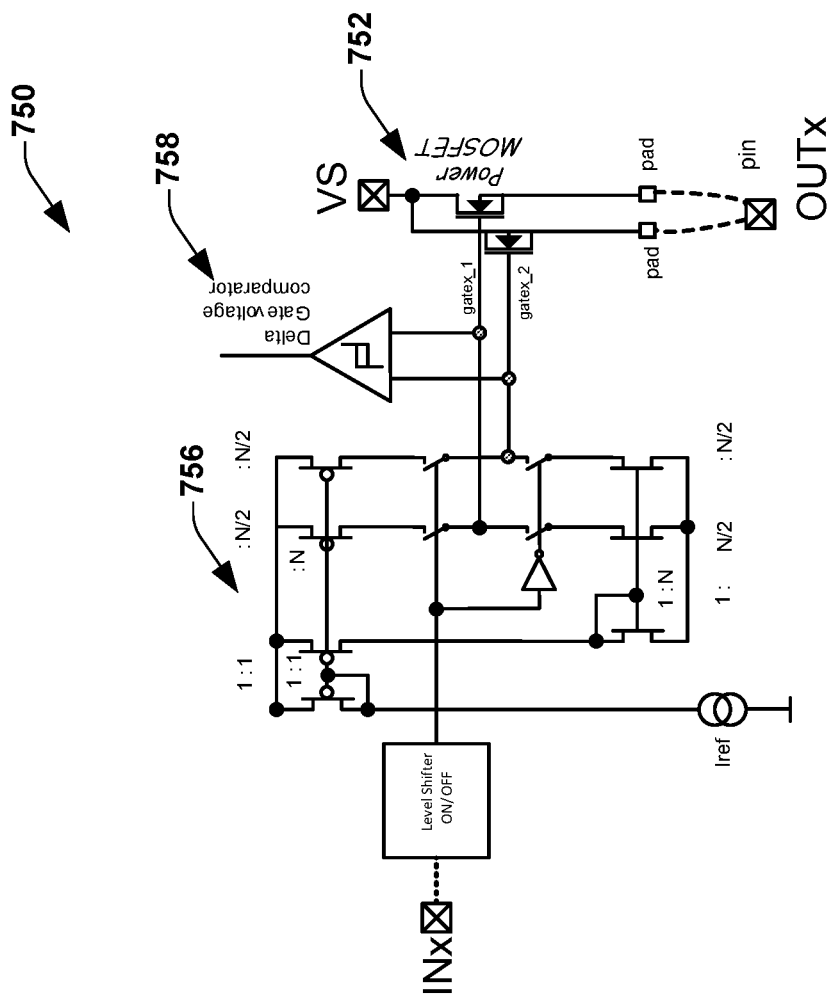

In some embodiments, the bondwire fault detection circuit 708 further comprises a detection circuit 710 configured to determine a fault associated with at least one source bondwire of the switching circuit 702 based on the measured voltage difference. In some embodiments, the detection circuit 710 is configured to compare the measured voltage difference to a predetermined threshold range comprising a predefined voltage difference range, in order to determine a fault associated with at least one source bondwire of the switching circuit 702. In some embodiments, a fault associated with at least one source bondwire of the switching circuit 702 is detected at the detection circuit 710, when the measured voltage difference is not within the predefined voltage difference range. Upon detecting a fault, in some embodiments, the detection circuit 710 is further configured to generate a fault indication signal (not shown) that provides an indication of a possible loss or damage associated with the source bondwires of the switching circuit 702. In some embodiments, the power electronic system 750 in FIG. 7b depicts one possible way of implementation of the power electronic system 700 in FIG. 7a. The power electronic system 750 comprises a switching circuit 752, a delta gate voltage comparator 758 and a gate driver circuit 756. In some embodiments, the delta gate voltage comparator 758 depicts one possible way of implementation of the bondwire fault detection circuit 708 in FIG. 7a. In some embodiments, the delta gate voltage comparator 758 determines if a voltage difference between two gate voltages is within a predefined range. In some embodiments, the gate driver circuit 756 in FIG. 7b depicts one possible way of implementation of the gate driver circuit 706 in FIG. 7a. The gate driver circuit 756 comprises separate charge/discharge structures to be coupled to the separated gates associated with the switching circuit.

Figure 8:
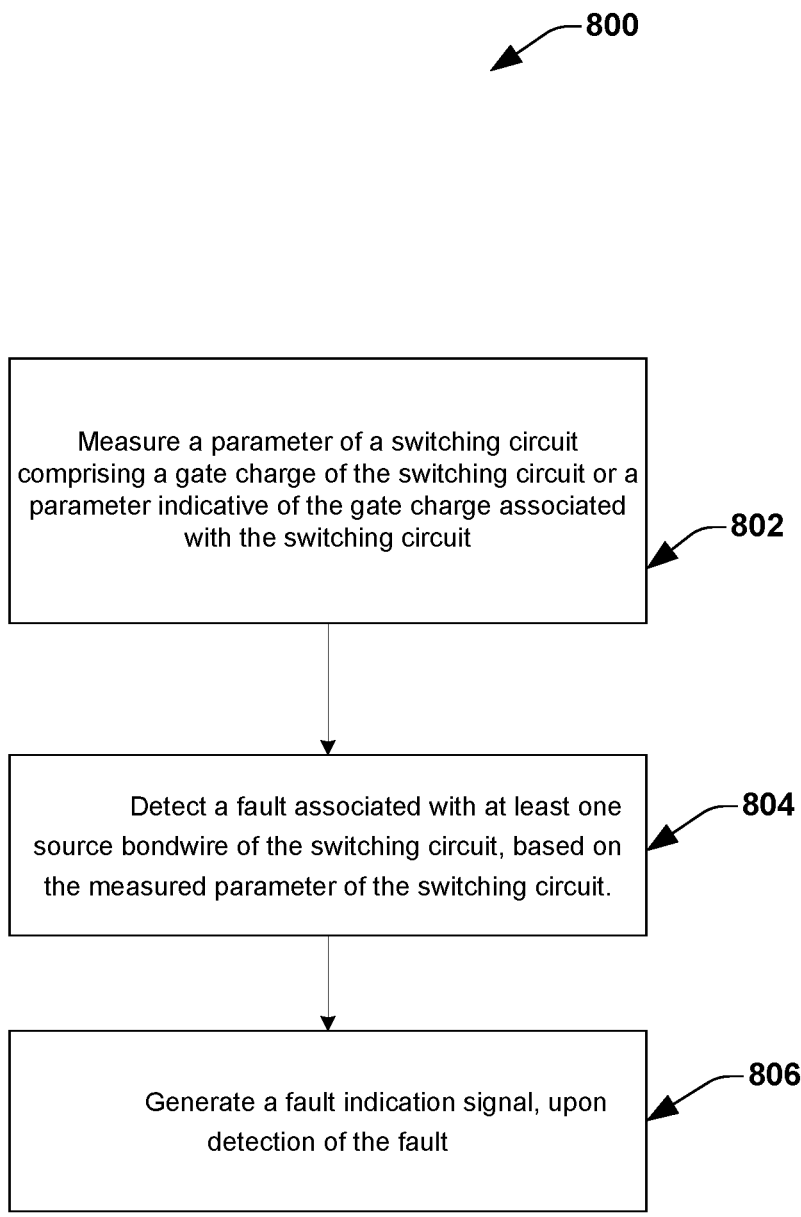
FIG. 8 illustrates a method for detecting a fault associated with a source bondwire of a switching circuit, according to one embodiment of the disclosure.

FIG. 8 illustrates a flow chart for a method 800 for detecting a fault associated with a source bondwire of a switching circuit, according to one embodiment of the disclosure. In some embodiments, the switching circuit comprises a plurality of switches in parallel, each switch comprising a respective source bondwire. The method 800 is explained herein with reference to the power electronic system 100 in FIG. 1. However, the method is equally applicable to the power electronic system 400 in FIGS. 4a and 4b, the power electronic system 500 in FIGS. 5a and 5b, the power electronic system 600 in FIG. 6 and the power electronic system 700 in FIGS. 7a and 7b. Further, the method 800 may be applied to any power electronic system having a switching circuit comprising a plurality of power switches in parallel, in order to determine a loss or damage of at least one source bondwire associated with the switching circuit. At 802, a parameter of a switching circuit (e.g., the switching circuit 102 in FIG. 1) comprising a gate charge of the switching circuit or a parameter indicative of the gate charge associated with the switching circuit, is measured at a gate charge estimation circuit (e.g., the gate charge estimation circuit 112 in FIG. 1). In some embodiments, a measurement of the gate charge of the switching circuit or the parameter indicative of the gate charge of the switching circuit provides an indication of a possible damage/loss associated with at least one source bondwire of the switching circuit.

In some embodiments, the gate charge estimation circuit may comprise a current measurement circuit configured to generate a replica of a gate current at a common gate terminal of the switching circuit and a charge measurement circuit configured to determine a corresponding gate charge based on an integration of the generated replica of the gate current, as explained above with respect to FIG. 4. In some embodiments, the gate charge estimation circuit may comprise a time measurement circuit configured to measure a turn-on time required to turn on the switching circuit or a turn-off time required to turn off the switching circuit, as explained above with respect to FIG. 5a. In some embodiments, the turn-on time or the turn-off time of the switching circuit is indicative of the gate charge of the switching circuit. In some embodiments, the gate charge estimation circuit may comprise an alternating current (AC) source circuit coupled to a common gate terminal of the switching circuit and configured to output an AC signal to the common gate terminal, and an amplitude detector circuit configured to measure an amplitude of the AC signal at the common gate terminal, as explained above with respect to FIG. 6. In some embodiments, the amplitude of the AC signal is indicative of the gate charge of the switching circuit. Further, in some embodiment, the gate charge estimation circuit may comprise a gate voltage comparator circuit configured to measure a voltage difference between a first gate voltage associated with a first power switch of the plurality of switches and a second gate voltage associated with a second power switch of the plurality of switches, during a turn-on phase or a turn-off phase of the switching circuit, as explained above with respect to FIG. 7a. In some embodiments, the measured voltage difference is indicative of the gate charge of the switching circuit.

At 804, a fault associated with at least one source bondwire of the switching circuit is detected at a detection circuit (e.g., the detection circuit 110 in FIG. 1), based on the measured parameter of the switching circuit. In some embodiments, the fault associated with at least one source bondwire of the switching circuit is detected at the detection circuit based on a comparison of the measured parameter of the switching circuit to a predetermined measurement parameter threshold. In some embodiments, the predetermined measurement parameter threshold comprises an earlier value of the measured parameter of the switching circuit measured at an earlier instant of time. Alternately, in other embodiments, the fault associated with at least one source bondwire of the switching circuit is detected at the detection circuit based on a comparison of the measured parameter of the switching circuit to a predefined threshold range. At 806, a fault indication signal is generated at the detection circuit, upon detecting a fault associated with at least one source bondwire of the switching circuit. In some embodiments, the fault indication signal provides an indication of a possible loss or damage associated with at least one source bondwire of the switching circuit.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a driver circuit, comprising a gate driver circuit configured to drive a switching circuit comprising a plurality of switches in parallel, each switch comprising a respective source bondwire; and a bondwire fault detection circuit comprising a gate charge estimation circuit configured to measure a parameter of the switching circuit comprising a gate charge of the switching circuit or a parameter indicative of the gate charge associated with the switching circuit; and a detection circuit configured to detect a fault associated with at least one source bondwire of the switching circuit, based on the measured parameter of the switching circuit.

Example 2 is a driver circuit, including the subject matter of example 1, wherein the gate charge estimation circuit is configured to measure the parameter of the switching circuit at a plurality of switching events associated with the switching circuit.

Example 3 is a driver circuit, including the subject matter of examples 1-2, including or omitting elements, wherein the detection circuit is configured to detect the fault based on a comparison of the measured parameter of the switching circuit to a predetermined measured parameter threshold.

Example 4 is a driver circuit, including the subject matter of examples 1-3, including or omitting elements, wherein the predetermined measured parameter threshold comprises an earlier value of the measured parameter of the switching circuit measured at an earlier instant of time.

Example 5 is a driver circuit, including the subject matter of examples 1-4, including or omitting elements, wherein the gate charge estimation circuit comprises a current measurement circuit configured to generate a replica of a gate current at a common gate terminal of the switching circuit, and a charge measurement circuit configured to determine a corresponding gate charge based on an integration of the generated replica of the gate current.

Example 6 is a driver circuit, including the subject matter of examples 1-5, including or omitting elements, wherein the gate charge estimation circuit comprises a time measurement circuit configured to measure a turn-on time required to turn on the switching circuit or a turn-off time required to turn off the switching circuit, wherein the turn-on time and the turn-off time are indicative of the gate charge of the switching circuit.

Example 7 is a driver circuit, including the subject matter of examples 1-6, including or omitting elements, wherein the time measurement circuit comprises a counter configured to start counting at a start time of the gate driver circuit and stop counting when the switching circuit is turned on, thereby measuring the turn-on time of the switching circuit.

Example 8 is a driver circuit, including the subject matter of examples 1-7, including or omitting elements, wherein the gate charge estimation circuit comprises an alternating current (AC) source circuit coupled to a common gate terminal of the switching circuit and configured to output an AC signal to the common gate terminal; and an amplitude detector circuit configured to measure an amplitude of the AC signal at the common gate terminal, wherein the amplitude of the AC signal is indicative of the gate charge of the switching circuit.

Example 9 is a driver circuit, including the subject matter of examples 1-8, including or omitting elements, wherein the gate charge estimation circuit comprises a gate voltage comparator circuit configured to measure a voltage difference between a first gate voltage associated with a first switch of the plurality of switches and a second gate voltage associated with a second switch of the plurality of switches, during a turn-on phase or a turn-off phase of the switching circuit, wherein the measured voltage difference is indicative of the gate charge of the switching circuit.

Example 10 is a driver circuit, including the subject matter of examples 1-9, including or omitting elements, wherein the detection circuit is configured to detect the fault based on a comparison of the measured voltage difference to a predefined voltage difference range.

Example 11 is a method for detecting a fault associated with a source bondwire in a switching circuit comprising a plurality of switches in parallel, each switch comprising a respective source bondwire, the method comprising measuring a parameter of the switching circuit comprising a gate charge of the switching circuit or a parameter indicative of the gate charge associated with the switching circuit; and detecting a fault associated with at least one source bondwire of the switching circuit, based on the measured parameter of the switching circuit.

Example 12 is a method, including the subject matter of example 11, further comprising repeating the measurement of the parameter of the switching circuit at a plurality of switching events associated with the switching circuit.

Example 13 is a method, including the subject matter of examples 11-12, including or omitting elements, wherein detecting the fault associated with the at least one source bondwire of the switching circuit comprises comparing the measured parameter of the switching circuit to a predetermined measured parameter threshold.

Example 14 is a method, including the subject matter of examples 11-13, including or omitting elements, wherein the predetermined measured parameter threshold comprises an earlier value of the measured parameter of the switching circuit measured at an earlier instant of time.

Example 15 is a method, including the subject matter of examples 11-14, including or omitting elements, wherein detecting the fault associated with the at least one source bondwire of the switching circuit comprises comparing the measured parameter of the switching circuit to a predetermined threshold range.

Example 16 is a bondwire fault detection circuit, comprising a gate charge estimation circuit configured to measure a parameter of a switching circuit comprising a plurality of switches in parallel, each switch comprising a respective source bondwire, the parameter of the switching circuit comprising a gate charge of the switching circuit or a parameter indicative of the gate charge associated with the switching circuit; and a detection circuit configured to detect a fault associated with at least one source bondwire associated with the switching circuit, based on the measured parameter of the switching circuit.

Example 17 is a circuit, including the subject matter of example 16, wherein the gate charge estimation circuit is configured to measure the parameter of the switching circuit at a plurality of switching events associated with the switching circuit.

Example 18 is a circuit, including the subject matter of examples 16-17, including or omitting elements, wherein the detection circuit is configured to detect the fault based on a comparison of the measured parameter of the switching circuit to a predetermined measured parameter threshold.

Example 19 is a circuit, including the subject matter of examples 16-18, including or omitting elements, wherein the predetermined measured parameter threshold comprises an earlier value of the measured parameter of the switching circuit measured at an earlier instant of time.

Example 20 is a circuit, including the subject matter of examples 16-19, including or omitting elements, wherein the gate charge estimation circuit comprises a current measurement circuit configured to measure a gate current at a common gate terminal of the switching circuit, and a charge measurement circuit configured to determine a corresponding gate charge based on an integration of the measured gate current.

Example 21 is a circuit, including the subject matter of examples 16-20, including or omitting elements, wherein the gate charge estimation circuit comprises a time measurement circuit configured to measure a turn-on time required to turn on the switching circuit or a turn-off time required to turn off the switching circuit, wherein the turn-on time and the turn-off time are indicative of the gate charge of the switching circuit.

Example 22 is a circuit, including the subject matter of examples 16-21, including or omitting elements, wherein the gate charge estimation circuit comprises an alternating current (AC) source circuit coupled to a common gate terminal of the switching circuit and configured to output an AC signal to the common gate terminal; and an amplitude detector circuit configured to measure an amplitude of the AC signal at the common gate terminal, wherein the amplitude of the AC signal is indicative of the gate charge of the switching circuit.

Example 23 is a circuit, including the subject matter of examples 16-22, including or omitting elements, wherein the gate charge estimation circuit comprises a gate voltage comparator circuit configured to measure a voltage difference between a first gate voltage associated with a first switch of the plurality of switches and a second gate voltage associated with a second switch of the plurality of switches, during a turn-on phase or a turn-off phase of the switching circuit, wherein the measured voltage difference is indicative of the gate charge of the switching circuit.

Example 24 is a circuit, including the subject matter of examples 16-23, including or omitting elements, wherein the detection circuit is configured to detect the fault based on a comparison of the measured voltage difference to a predefined voltage difference range.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A driver circuit, comprising:
    a gate driver circuit configured to drive a switching circuit comprising a plurality of switches in parallel, each switch comprising a respective source bondwire; and
    a bondwire fault detection circuit comprising:
        a gate charge estimation circuit configured to measure a parameter of the switching circuit comprising a gate charge of the switching circuit or a parameter indicative of the gate charge associated with the switching circuit; and
        a detection circuit configured to detect a fault associated with at least one source bondwire of the switching circuit, based on the measured parameter of the switching circuit.

2. The driver circuit of claim 1, wherein the gate charge estimation circuit is configured to measure the parameter of the switching circuit at a plurality of switching events associated with the switching circuit.

3. The driver circuit of claim 1, wherein the detection circuit is configured to detect the fault based on a comparison of the measured parameter of the switching circuit to a predetermined measured parameter threshold.

4. The driver circuit of claim 3, wherein the predetermined measured parameter threshold comprises an earlier value of the measured parameter of the switching circuit measured at an earlier instant of time.

5. The driver circuit of claim 3, wherein the gate charge estimation circuit comprises:
    a current measurement circuit configured to generate a replica of a gate current at a common gate terminal of the switching circuit, and
    a charge measurement circuit configured to determine a corresponding gate charge based on an integration of the generated replica of the gate current.

6. The driver circuit of claim 3, wherein the gate charge estimation circuit comprises a time measurement circuit configured to measure a turn-on time required to turn on the switching circuit or a turn-off time required to turn off the switching circuit, wherein the turn-on time and the turn-off time are indicative of the gate charge of the switching circuit.

7. The driver circuit of claim 6, wherein the time measurement circuit comprises a counter configured to start counting at a start time of the gate driver circuit and stop counting when the switching circuit is turned on, thereby measuring the turn-on time of the switching circuit.

8. The driver circuit of claim 3, wherein the gate charge estimation circuit comprises:
    an alternating current (AC) source circuit coupled to a common gate terminal of the switching circuit and configured to output an AC signal to the common gate terminal; and
    an amplitude detector circuit configured to measure an amplitude of the AC signal at the common gate terminal, wherein the amplitude of the AC signal is indicative of the gate charge of the switching circuit.

9. The driver circuit of claim 1, wherein the gate charge estimation circuit comprises a gate voltage comparator circuit configured to measure a voltage difference between a first gate voltage associated with a first switch of the plurality of switches and a second gate voltage associated with a second switch of the plurality of switches, during a turn-on phase or a turn-off phase of the switching circuit, wherein the measured voltage difference is indicative of the gate charge of the switching circuit.

10. A method for detecting a fault associated with a source bondwire in a switching circuit comprising a plurality of switches in parallel, each switch comprising a respective source bondwire, the method comprising:
    measuring a parameter of the switching circuit comprising a gate charge of the switching circuit or a parameter indicative of the gate charge associated with the switching circuit; and
    detecting a fault associated with at least one source bondwire of the switching circuit, based on the measured parameter of the switching circuit.

11. The method of claim 10, further comprising repeating the measurement of the parameter of the switching circuit at a plurality of switching events associated with the switching circuit.

12. The method of claim 10, wherein detecting the fault associated with the at least one source bondwire of the switching circuit comprises comparing the measured parameter of the switching circuit to a predetermined measured parameter threshold.

13. The method of claim 12, wherein the predetermined measured parameter threshold comprises an earlier value of the measured parameter of the switching circuit measured at an earlier instant of time.

14. A bondwire fault detection circuit, comprising:
    a gate charge estimation circuit configured to measure a parameter of a switching circuit comprising a plurality of switches in parallel, each switch comprising a respective source bondwire, the parameter of the switching circuit comprising a gate charge of the switching circuit or a parameter indicative of the gate charge associated with the switching circuit; and
    a detection circuit configured to detect a fault associated with at least one source bondwire associated with the switching circuit, based on the measured parameter of the switching circuit.

15. The bondwire fault detection circuit of claim 14, wherein the gate charge estimation circuit is configured to measure the parameter of the switching circuit at a plurality of switching events associated with the switching circuit.

16. The bondwire fault detection circuit of claim 14, wherein the detection circuit is configured to detect the fault based on a comparison of the measured parameter of the switching circuit to a predetermined measured parameter threshold.

17. The bondwire fault detection circuit of claim 16, wherein the predetermined measured parameter threshold comprises an earlier value of the measured parameter of the switching circuit measured at an earlier instant of time.

18. The bondwire fault detection circuit of claim 16, wherein the gate charge estimation circuit comprises:
 a current measurement circuit configured to measure a gate current at a common gate terminal of the switching circuit, and
 a charge measurement circuit configured to determine a corresponding gate charge based on an integration of the measured gate current.

19. The bondwire fault detection circuit of claim 16, wherein the gate charge estimation circuit comprises a time measurement circuit configured to measure a turn-on time required to turn on the switching circuit or a turn-off time required to turn off the switching circuit, wherein the turn-on time and the turn-off time are indicative of the gate charge of the switching circuit.

20. The bondwire fault detection circuit of claim 16, wherein the gate charge estimation circuit comprises:
 an alternating current (AC) source circuit coupled to a common gate terminal of the switching circuit and configured to output an AC signal to the common gate terminal; and
 an amplitude detector circuit configured to measure an amplitude of the AC signal at the common gate terminal, wherein the amplitude of the AC signal is indicative of the gate charge of the switching circuit.

21. The bondwire fault detection circuit of claim 14, wherein the gate charge estimation circuit comprises a gate voltage comparator circuit configured to measure a voltage difference between a first gate voltage associated with a first switch of the plurality of switches and a second gate voltage associated with a second switch of the plurality of switches, during a turn-on phase or a turn-off phase of the switching circuit, wherein the measured voltage difference is indicative of the gate charge of the switching circuit.

22. The driver circuit of claim 1, wherein the parameter of the switching circuit comprising the gate charge or the parameter indicative of the gate charge is measured based on measurements performed at gate terminals associated with the one or more switches, wherein the gate terminal of a respective switch comprises a terminal that is different from a terminal to which the respective source bondwire is coupled.

23. The method of claim 10, wherein the parameter of the switching circuit comprising the gate charge or the parameter indicative of the gate charge is measured based on measurements performed at gate terminals associated with the one or more switches, wherein the gate terminal of a respective switch comprises a terminal that is different from a terminal to which the respective source bondwire is coupled.

24. The bondwire fault detection circuit of claim 14, wherein the parameter of the switching circuit is measured based on measurements performed at gate terminals associated with the one or more switches, wherein the gate terminal of a respective switch comprises a terminal that is different from a terminal to which the respective source bondwire is coupled.

* * * * *